US012749787B2

(12) United States Patent
Liu et al.

(10) Patent No.: US 12,749,787 B2
(45) Date of Patent: Sep. 29, 2026

(54) ISOLATOR

(71) Applicants: Kabushiki Kaisha Toshiba, Tokyo (JP); Toshiba Electronic Devices & Storage Corporation, Tokyo (JP)

(72) Inventors: Jia Liu, Yokohama Kanagawa (JP); Yusuke Imaizumi, Kawasaki Kanagawa (JP); Minoru Takizawa, Sagamihara Kanagawa (JP); Yoshinari Tamura, Yokohama Kanagawa (JP); Daijo Chida, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 634 days.

(21) Appl. No.: 18/157,743

(22) Filed: Jan. 20, 2023

(65) Prior Publication Data

US 2024/0097303 A1    Mar. 21, 2024

(30) Foreign Application Priority Data

Sep. 20, 2022 (JP) ................................ 2022-149173

(51) Int. Cl.
*H01F 17/00* (2006.01)
*H01F 27/32* (2006.01)
(Continued)

(52) U.S. Cl.
CPC ........... *H01P 1/36* (2013.01); *H01F 17/0033* (2013.01); *H01F 27/32* (2013.01); *H01F 17/0013* (2013.01); *H10W 90/00* (2026.01)

(58) Field of Classification Search
CPC .. H01F 17/0013; H01F 17/0033; H01F 17/00; H01F 2019/085; H01F 2027/2809;
(Continued)

(56) References Cited

U.S. PATENT DOCUMENTS 4,079,359 A * 3/1978 Gergis .................... H01F 41/34 216/13
4,160,274 A * 7/1979 Stephenson, Jr. .... G11C 19/085 365/2
(Continued)

FOREIGN PATENT DOCUMENTS

JP H0397386 U 10/1991
JP H06120048 A 4/1994
(Continued)

OTHER PUBLICATIONS

Notice of Reasons for Refusal (Office Action) mailed Jul. 8, 2025 in corresponding Japanese patent Application No. 2022-149173, with English machine translation, 10 pages.

*Primary Examiner* — Timothy J Thompson
*Assistant Examiner* — Guillermo J Egoavil
(74) *Attorney, Agent, or Firm* — Kim & Stewart LLP

(57) ABSTRACT

According to one embodiment, an isolator includes a first coil, a second coil, a plate-shaped first magnet, and a first insulator. The second coil is aligned with the first coil along a first axis and faces the first coil. The first magnet is provided on a side of the second coil and faces the second coil, the side being opposite to a side where the first coil is located. The first magnet extends along a first plane intersecting the first axis. The first insulator seals the first coil, the second coil, and the first magnet.

7 Claims, 10 Drawing Sheets

(51) Int. Cl.
*H01L 25/065* (2023.01)
*H01P 1/36* (2006.01)
*H10W 90/00* (2026.01)

(58) Field of Classification Search
CPC ......... H01F 2027/2819; H01F 27/2804; H01F 27/32; H01L 2225/06531; H01L 25/0655; H01L 25/065; H01P 1/36
USPC .......................................................... 361/803
See application file for complete search history.

(56) References Cited

U.S. PATENT DOCUMENTS

| | | | |
|---|---|---|---|
| 5,420,558 | A | 5/1995 | Ito et al. |
| 5,525,941 | A | 6/1996 | Roshen et al. |
| 9,318,784 | B2 | 4/2016 | Sin et al. |
| 9,761,545 | B2 | 9/2017 | Sin et al. |
| 2006/0180342 | A1 | 8/2006 | Takaya et al. |
| 2008/0061631 | A1 | 3/2008 | Fouquet et al. |
| 2010/0148911 | A1 | 6/2010 | Fouquet et al. |
| 2015/0137314 | A1 | 5/2015 | Osada et al. |
| 2016/0072167 | A1* | 3/2016 | Kawai ................. H01P 1/20345 333/24 R |
| 2019/0109233 | A1 | 4/2019 | Tellkamp et al. |
| 2020/0211939 | A1 | 7/2020 | Khanolkar et al. |
| 2021/0375525 | A1* | 12/2021 | Kao .................... H01F 27/2804 |
| 2023/0307954 | A1* | 9/2023 | Tokui .................... H02J 50/005 |
| 2023/0309228 | A1 | 9/2023 | Imaizumi et al. |

FOREIGN PATENT DOCUMENTS

| | | | | |
|---|---|---|---|---|
| JP | H0714714 | A | 1/1995 | |
| JP | H11-54336 | A | 2/1999 | |
| JP | 2000058341 | A | 2/2000 | |
| JP | 2003-324020 | A | 11/2003 | |
| JP | 2007037087 | A | 2/2007 | |
| JP | 2008061236 | A | 3/2008 | |
| JP | 2009071253 | A | 4/2009 | |
| JP | 2009-141271 | A | 6/2009 | |
| JP | 2010128569 | A * | 6/2010 | ............... H02B 1/38 |
| JP | 2012182740 | A | 9/2012 | |
| JP | 2012195327 | A | 10/2012 | |
| JP | 2014-522561 | A | 9/2014 | |
| JP | 2016028407 | A | 2/2016 | |
| JP | 2017-538277 | A | 12/2017 | |
| JP | 2022517550 | A | 3/2022 | |
| JP | 2022115785 | A | 8/2022 | |
| JP | 2023142367 | A * | 10/2023 | .............. H02J 50/10 |
| WO | 2013046259 | A1 | 4/2013 | |
| WO | 2021257934 | A1 | 12/2021 | |
| WO | 2022212305 | A1 | 10/2022 | |

* cited by examiner

ISOLATOR

CROSS-REFERENCE TO RELATED APPLICATION(S)

This application is based upon and claims the benefit of priority from Japanese Patent Application No. 2022-149173, filed Sep. 20, 2022, the entire contents of which are incorporated herein by reference.

FIELD

Embodiments of the present invention relate to an isolator.

BACKGROUND

An isolator that includes a transmit circuit and a receive circuit insulated from each other and with which a signal can be transmitted from the transmit circuit to the receive circuit is known.

BRIEF DESCRIPTION OF THE DRAWING(S)

DETAILED DESCRIPTION

In general, according to one embodiment, an isolator includes a first coil, a second coil, a plate-shaped first magnet, and a first insulator. The second coil is aligned with the first coil along a first axis and faces the first coil. The first magnet is provided on a side of the second coil and faces the second coil, the side being opposite to a side where the first coil is located. The first magnet extends along a first plane intersecting the first axis. The first insulator seals the first coil, the second coil, and the first magnet.

Embodiments will now be described with reference to the figures.

The entire description of a particular embodiment and a particular modification also apply to another embodiment and another modification unless explicitly mentioned otherwise or obviously excluded. The dimensions and ratio of dimensions of a component in the figures may differ from those in actuality. The figures may include components which differ in relations and/or ratios of dimensions in different figures.

The embodiments will be described using an xyz orthogonal coordinate system. In the description below, the term "below" as well as the terms derived therefrom and related thereto refer to a position having a smaller coordinate on the z-axis, and "above" as well as the terms derived therefrom and the terms related thereto refer to a position having a larger coordinate on the z-axis.

1. First Embodiment

Figure 1:
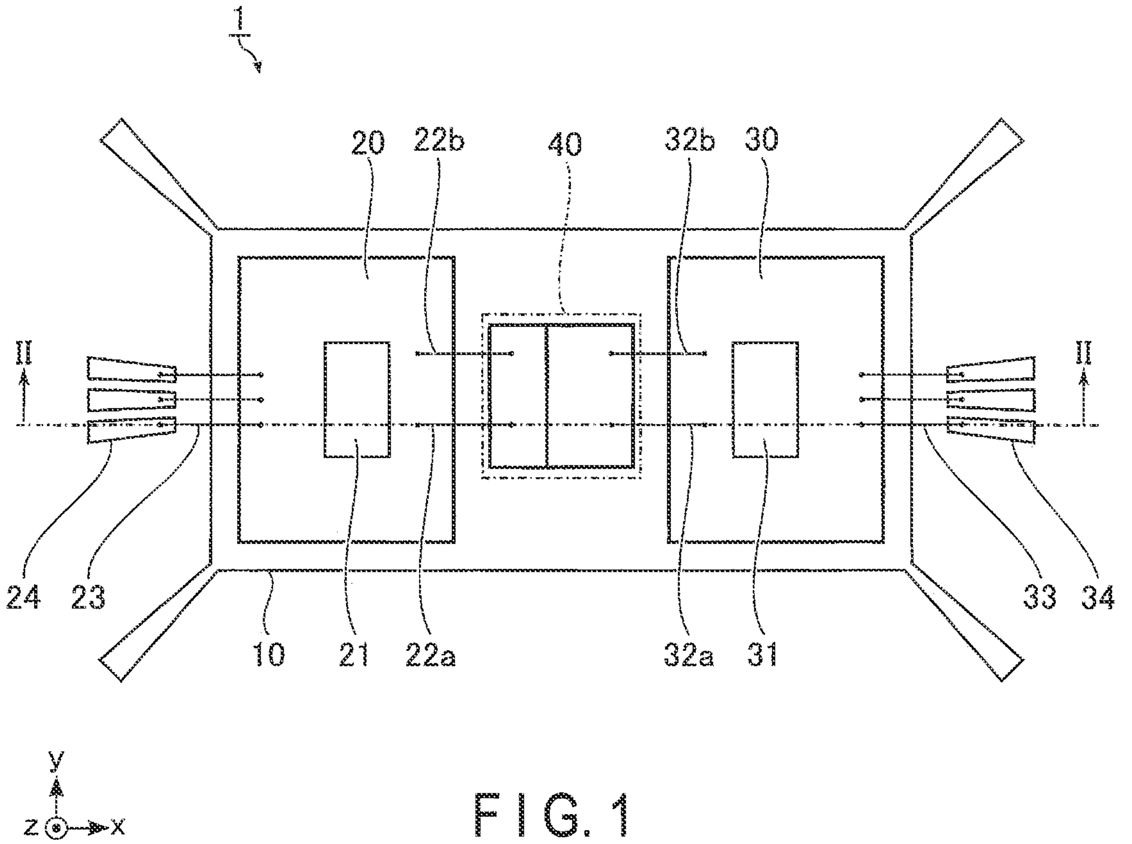
FIG. 1 shows an example of a planar structure of an isolator of a first embodiment.
Figure 2:
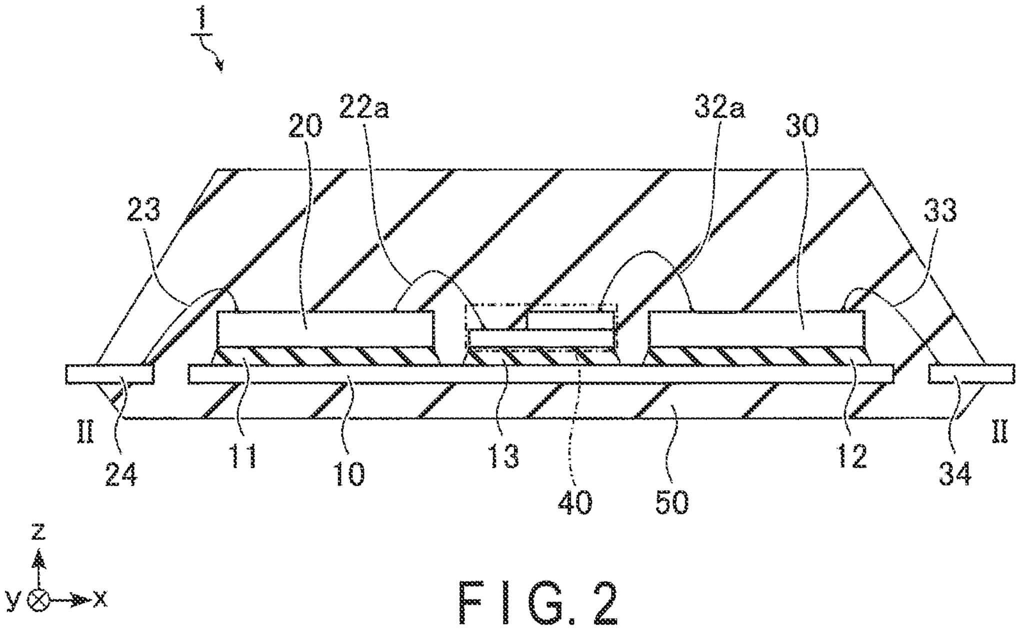
FIG. 2 shows an example of a cross-sectional structure of the isolator of the first embodiment.

FIG. 1 shows a planar structure of an isolator of the first embodiment. FIG. 2 shows an example of a structure of the isolator according to the first embodiment, and shows a cross section along line II-II shown in FIG. 1.

As shown in FIGS. 1 and 2, the isolator 1 includes a frame 10, semiconductor chips 20 and 30, an isolator module 40, adhesion members 11, 12, and 13, bonding wires 22*a*, 22*b*, 23, 32*a*, 32*b*, and 33, external connecting terminals 24 and 34, and an insulator 50. The insulator 50 is not shown in FIG. 1.

The frame 10 is a plate-shaped metal. The frame supports the semiconductor chips 20 and 30 and the isolator module 40. The frame 10 expands along an x-y plane.

The semiconductor chip 20 is an integrated circuit (IC) chip formed on a semiconductor. The semiconductor chip 20 is disposed on the upper surface of the frame 10, with the adhesion member 11 interposed therebetween. The semiconductor chip 20 includes a circuit 21 inside. The circuit 21 includes a signal transmit and receive circuit and a signal modulation and demodulation circuit.

The semiconductor chip 30 is an IC chip formed on a semiconductor. The semiconductor chip 30 is disposed on the upper surface of the frame 10, with the adhesion member 12 interposed therebetween. The semiconductor chip 30 and the semiconductor chip 20 are aligned along an x-axis. The semiconductor chip 30 includes a circuit 31 inside. The circuit 31 includes a signal transmit and receive circuit and a signal modulation and demodulation circuit.

The isolator module 40 is a module functioning as a digital isolator. The isolator module 40 is disposed on the upper surface of the frame 10, with the adhesion member 13 interposed therebetween. The isolator module 40 is located between the semiconductor chip 20 and the semiconductor chip 30, along the x-axis. The isolator module 40 includes a transformer. The isolator module 40 is configured to, with a use of a transformer, transmit signals between the transmit circuit (primary circuit) and the receive circuit (secondary circuit), with the circuits being insulated from each other. The isolator module 40 will be described in detail later.

The bonding wires 22*a* and 22*b* electrically couple the semiconductor chip 20 with the isolator module 40.

The bonding wires 32*a* and 32*b* electrically couple the semiconductor chip 30 with the isolator module 40.

The external connecting terminals 24 are aligned with the frame 10 along the x-axis. The external connecting terminals 24 are electrically to the semiconductor chip 20 by the bonding wires 23.

The external connecting terminals 34 are aligned with the frame 10 along the x-axis. The external connecting terminals 34 are electrically coupled to the semiconductor chip 30 by the bonding wires 33.

The insulator 50 includes a resin, for example. The insulator 50 seals the frame 10, the semiconductor chips 20 and 30, the isolator module 40, and the bonding wires 22*a*, 22*b*, 23, 32*a*, 32*b*, and 33. The external connecting terminals 24 and 34 are partially exposed to the outside of the insulator 50, being stationarily fixed by the insulator 50.

Figure 3:
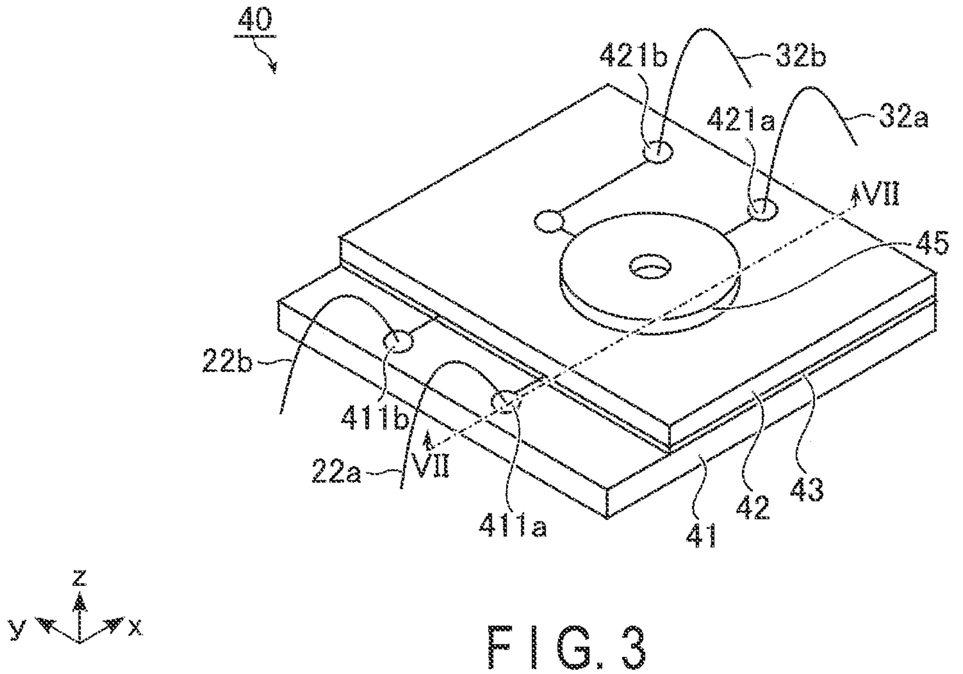
FIG. 3 is a perspective view showing a structure of an isolator module of the isolator according to the first embodiment.

FIG. 3 is a perspective view showing a structure of the isolator module of the isolator according to the first embodiment. FIG. 3 also shows some of the conductors inside the isolator module 40. FIG. 3 shows the isolator module 40 with the upper surface up.

The isolator module 40 includes, for example, wiring boards 41 and 42, an insulator 43, and a magnet 45.

The wiring board 41 is an insulator that includes wires therein. The wiring board 41 has a plate-like shape, for example a rectangular shape along an x-y plane. The wiring board 41 is a flexible printed circuit (FPC) wiring board, for example. The wiring board 41 includes a transmit circuit of the isolator module 40. The wiring board 41 includes conductive pads 411*a* and 411*b*. The pads 411*a* and 411*b* are aligned along one side of the isolator module 40 (one side of the wiring board 41). The pads 411*a* and 411*b* are in contact with the bonding wire 22*a* and 22*b*, respectively. The wiring board 41 will be described later in detail.

The insulator 43 is located on the upper surface of the wiring board 41.

The wiring board 42 is an insulator that includes wiring therein. The wiring board 42 is located on the upper surface of the insulator 43. The wiring board 42 has a plate-like shape, for example a rectangular shape along an x-y plane. The wiring board 42 is for example a flexible printed wiring board. The wiring board 42 includes a receive circuit of the isolator module 40. The wiring board 42 includes conductive pads 421*a* and 421*b*. The pads 421*a* and 421*b* are aligned along a side opposite to the side where the pads 411*a* and 411*b* of the isolator module 40 are aligned. The pads 421*a* and 421*b* are in contact with the bonding wires 32*a* and 32*b*, respectively. The area size of the wiring board 42 along the x-y plane is smaller than the area size of the wiring board 41 along the x-y plane. For this reason, the upper surface of the wiring board 41 is partially exposed. The pads 411*a* and 411*b* of the wiring board 41 are located in the area where the wiring board 41 is exposed from the wiring board 42. The wiring board 42 will be described later in detail.

The magnet 45 is a permanent magnet. Examples of the magnet 45 include a magnet containing iron and platinum, a magnet containing cobalt and iron, a magnet containing samarium and cobalt, and a magnet containing neodymium, iron, and boron. The magnet 45 is located on the upper surface of the wiring board 42. The magnet 45 has a circular-ring shape, for example. The magnet 45 has a plate-like shape expanding along the x-y plane.

The isolator module 40 can be made by, for example, bonding separately formed wiring boards 41 and 42 together with the insulator 43, which is an adhesive insulator.

Figure 4:
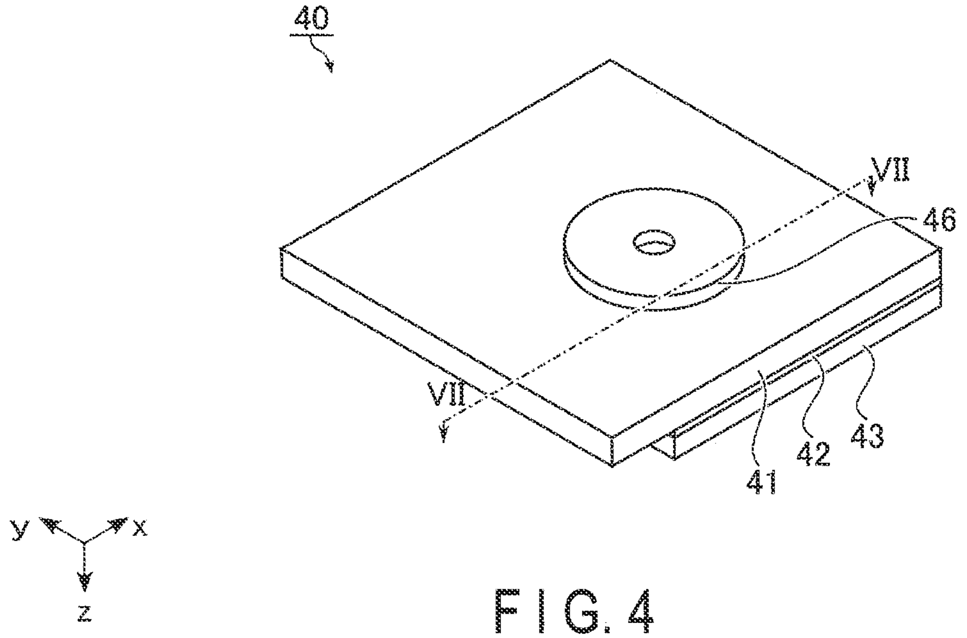
FIG. 4 is a perspective view showing a structure of the isolator module of the isolator according to the first embodiment.

FIG. 4 is a perspective view showing a structure of the isolator module of the isolator according to the first embodiment. FIG. 4 also shows some of the conductors inside the isolator module 40. FIG. 4 shows the isolator module 40 with the lower surface up. As shown in FIG. 4, the isolator module 40 further includes a magnet 46. The magnet 46 is a permanent magnet. Examples of the magnet 46 include a magnet containing iron and platinum, a magnet containing cobalt and iron, a magnet containing samarium and cobalt, and a magnet containing neodymium, iron, and boron. The magnet 46 is located on the lower surface of the wiring board 41. The magnet 46 has a circular-ring shape, for example. The magnet 46 has a plate-like shape expanding along the x-y plane.

Figure 5:
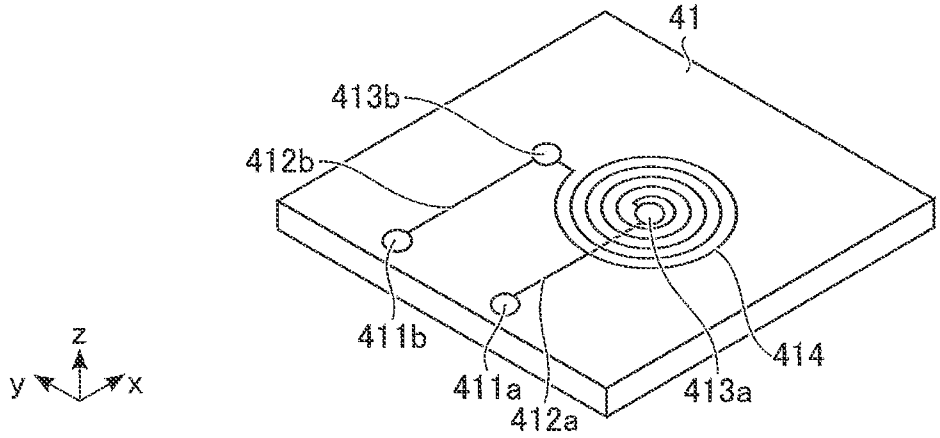
FIG. 5 is a perspective view showing a structure of a part of a wiring board of the isolator according to the first embodiment.

FIG. 5 is a perspective view showing a structure of the wiring board 41 of the isolator according to the first embodiment. FIG. 5 also shows some of the conductors inside the wiring board 41. As shown in FIG. 5, the wiring board 41 further includes conductors 412*a* and 412*b*, conductive plugs 413*a* and 413*b*, and a coil 414.

The coil 414 is a line-form conductor having a spiral shape along the x-y plane. In other words, the track of the line-form conductor constituting the coil 414 forms a spiral along the x-y plane. The spiral consists of a curve for example, and the outer shape along the x-y plane has a circular shape. The spiral can have any shape. The spiral may include a straight line. The outer shape of the spiral along the x-y plane may have a polygonal shape. The coil 414 may contain copper for example. The end located at the center of the coil 414 (central end) is connected to the plug 413*a*. The end opposite to the central end of the coil 414 (the outer periphery end) is coupled to the plug 413*b*.

The conductor 412*a* is in contact with the pad 411*a* and the plug 413*a*. The conductor 412*b* is in contact with the pad 411*b* and the plug 413*b*.

Electrical coupling between the conductors 412*a* and 412*b*, the plugs 413*a* and 413*b*, and the coil 414 provides a current path between the bonding wires 22*a* and 22*b*. The coil 414 may be called a "primary coil".

Figure 6:
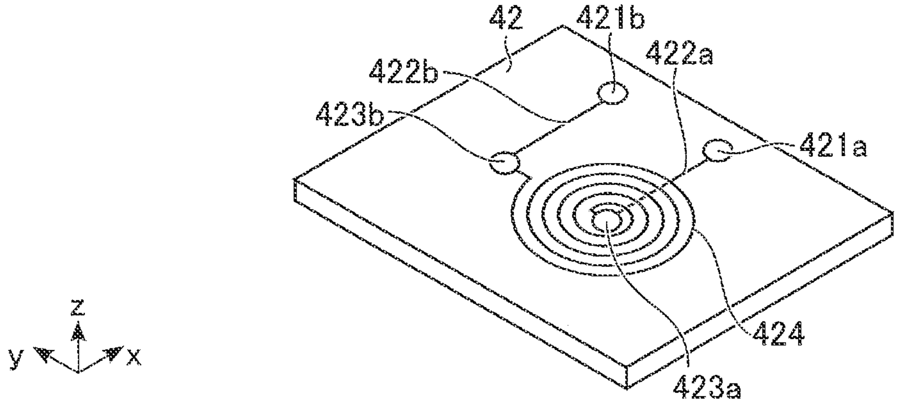
FIG. 6 is a perspective view showing a structure of a part of another wiring board of the isolator according to the first embodiment.

FIG. 6 is a perspective view showing a structure of the wiring board 42 of the isolator according to the first embodiment. FIG. 6 also shows some of the conductors inside the wiring board 42. As shown in FIG. 6, the wiring board 42 further includes conductors 422*a* and 422*b*, conductive plugs 423*a* and 423*b*, and a coil 424.

The coil 424 is a line-form conductor having a spiral shape along the x-y plane. In other words, the track of the line-form conductor constituting the coil 424 forms a spiral along the x-y plane. The spiral consists of a curve for example, and the outer shape along the x-y plane has a circular shape. The spiral can have any shape. The spiral may include a straight line. The outer shape of the spiral along the x-y plane may have a polygonal shape. The coil 424 may contain copper for example. The coil 424 may have the same outer shape as the coil 414, for example.

The coil 424 faces the coil 414. In other words, when viewed in the positive direction of the z-axis (+z direction), the coil 424 at least partially overlaps the coil 414, and, for example, the spiral part of the coil 424 overlaps the spiral part of the coil 414. For example, when viewed in the +z direction, the track of the coil 424 (the track of the conductor constituting the coil 424) overlaps the track of the coil 414.

The area surrounded by the innermost curve line of the track of the coil 424 partially overlaps the area surrounded by the innermost curve of the track of the coil 414. For this reason, when viewed in the +z direction, for example, in the center area of the coil 414 and the center area of the coil 414, there is an area where neither the track of the coil 414 nor the track of the coil 424 are present.

The central end of the coil 424 is coupled to the plug 423*a*. The outer periphery end of the coil 424 is coupled to the plug 423*b*.

The conductor 422*a* is in contact with the pad 421*a* and the plug 423*a*. The conductor 422*b* is in contact with the pad 421*b* and the plug 423*b*.

Electrical coupling between the conductors 422*a* and 422*b*, the plugs 423*a* and 423*b*, and the coil 424 provides a current path between the bonding wires 32*a* and 32*b*. The coil 414 may be called a "secondary coil".

Figure 7:
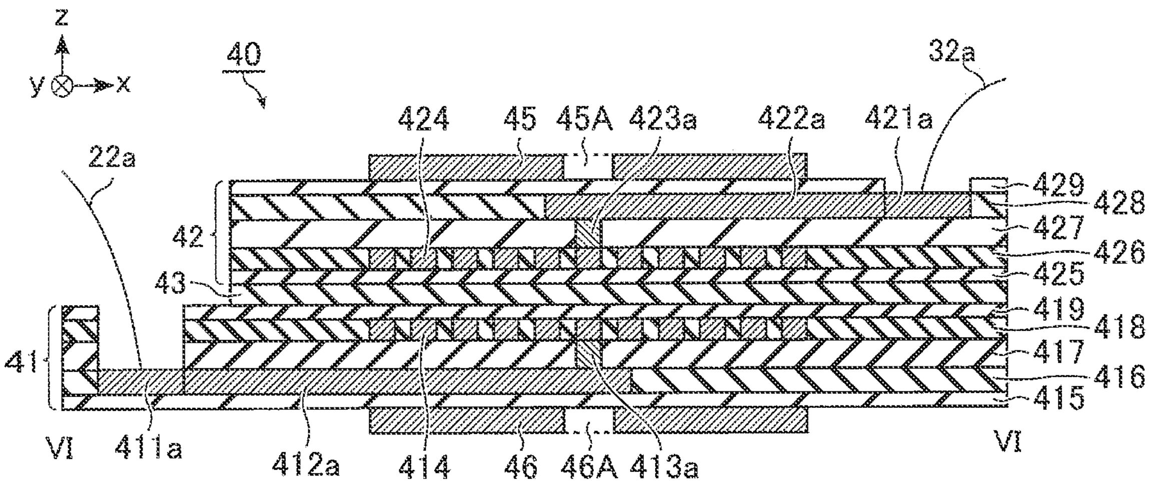
FIG. 7 shows an example of a cross-sectional structure of an isolator module according to the first embodiment.

FIG. 7 shows a cross-sectional structure of the isolator module of the isolator according to the first embodiment, and shows the cross section along line VII-VII shown in FIGS. 3 and 4. As shown in FIG. 7, the wiring board 41 includes insulators 415, 416, 417, 418, and 419. The insulators 415, 416, 417, 418, and 419 are stacked in this order in the +z direction. The insulators 415 and 419 respectively constitute the lower surface and the upper surface of the wiring board 41.

The conductor 412*a* is located in the insulator 416. The not-shown conductor 412*b* is also located in the insulator 416. The insulators 417, 418, and 419 are partially open, and the pad 411*a* is located below the opening. The pad 411*a* is formed with the conductor 412*a* as a unit, and a part of a conductor functioning as the pad 411*a* and the conductor 412*a* function as the pad 411*a*, and another part functions as the conductor 412*a*. Similarly, the insulators 417, 418, and 419 are partially open, and the pad 411*b* is located below the opening. The pad 411*b* is formed with the conductor 412*b* as a unit, and a part of a conductor functioning as the pad 411*b* and the conductor 412*b* function as the pad 411*b*, and another part of the conductor functions as the conductor 412*b*.

The plug 413*a* is located within the insulator 417 and penetrates the insulator 417 along the z axis. The lower surface of the plug 413*a* is in contact with the upper surface of the conductor 412*a*. The plug 413*b* (not shown) that penetrates the insulator 417 along the z axis is also located within the insulator 417. The plug 413*b* is in contact with the upper surface of the conductor 412*b* (not shown).

The coil 414 is located in the insulator 418. The lower surface of the coil 414 is in contact with the upper surface of the plug 413*a* and the upper surface of the plug 413*b*.

The wiring board 42 includes insulators 425, 426, 427, 428, and 429. The insulators 425, 426, 427, 428, and 429 are stacked in this order in the +z direction. The insulators 425 and 429 respectively constitute the lower surface and the upper surface of the wiring board 42.

The coil 424 is located in the insulator 426.

The plug 423*a* is located in the insulator 427 and penetrates the insulator 427 along the z-axis. The lower surface of the plug 423*a* is in contact with the upper surface of the coil 424. The plug 423*b* (not shown) that penetrates the insulator 427 along the z-axis is also located within the insulator 427. For example, the plug 423*a* is located immediately above the plug 423.

The conductor 422*a* is located in the upper surface of the insulator 428. The insulator 429 is partially open, and the pad 421*a* is located below the opening. The pad 421*a* is formed with the conductor 422*a* as a unit, and a part of a conductor functioning as the pad 421*a* and the conductor 422*a* function as the pad 421*a*, and another part functions as the conductor 422*a*. The lower surface of the conductor 422*a* is in contact with the upper surface of the plug 423*a*.

The not-shown conductor 422*b* is also located in the insulator 428. The insulator 429 is partially open, and the pad 421*b* is located below the opening. The pad 421*b* is formed with the conductor 422*b* as a unit, and the pad 421*b* and a part of the conductor functioning as the conductor 422*b* function as the pad 421*b*, and another part functions as the conductor 422*b*.

The magnet 45 is located on the upper surface of the insulator 429. The magnet 45 is located immediately above the coils 414 and 424. The magnet 45 has an opening 45A in the area that includes the center along the x-y plane. The opening 45A reaches the lower surface from the upper surface of the magnet 45, for example. The magnet 45 is arranged with a side up with which the same magnetic field is generated as that caused by a current flowing in a primary circuit. For example, if a current flows from the bonding wire 22*a* to the bonding wire 22*b*, a magnetic field in a downward direction (the negative direction of the z-axis, namely the −z direction) is caused in the coil 414. In this case, the magnet 45 has the north pole on the upper side and the south pole on the lower side.

The magnet 46 is located on the lower surface of the insulator 415. The magnet 46 is located immediately below the coils 414 and 424. The magnet 46 has an opening 46A in the area that includes the center along the x-y plane. The opening 46A reaches the lower surface from the upper surface of the magnet 46. The magnet 46 is arranged with a side up with which the same magnetic field is generated as that caused by a current flowing in a primary circuit and in the same direction as the magnet 45. For example, if the magnet 45 has the north pole on the upper side and the south pole on the lower side, the magnet 46 has the north pole on the upper side and the south pole on the lower side.

Figure 8:
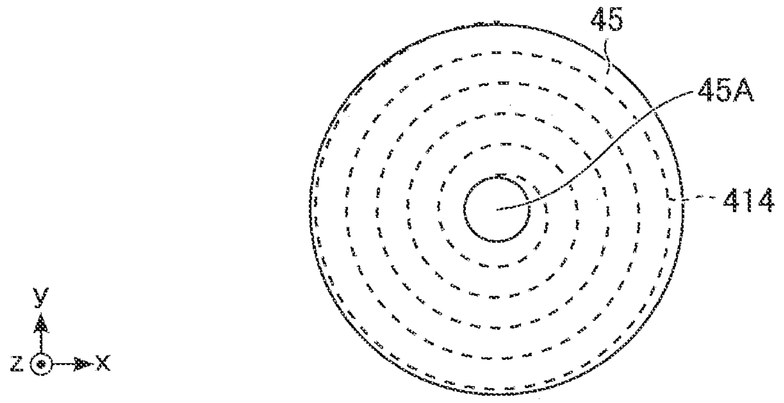
FIG. 8 shows an example of a structure of an isolator module of the isolator according to the first embodiment, along an x-y plane.

FIG. 8 shows an example of a structure of an isolator module of the isolator according to the first embodiment, along an x-y plane. FIG. 8 shows the coil 414 and the magnet 45 of the isolator module 40 only. As shown in FIG. 8, the opening 45A is accommodated inside the track of the innermost curve of the conductor (shown by a dashed line) constituting the coil 414. The opening 45A is not necessarily accommodated inside the track of the innermost curve of the conductor constituting the coil 414. It is most desirable for the center of the opening 45A to overlap the center of the coil 414 when viewed in the +z direction.

Figure 9:
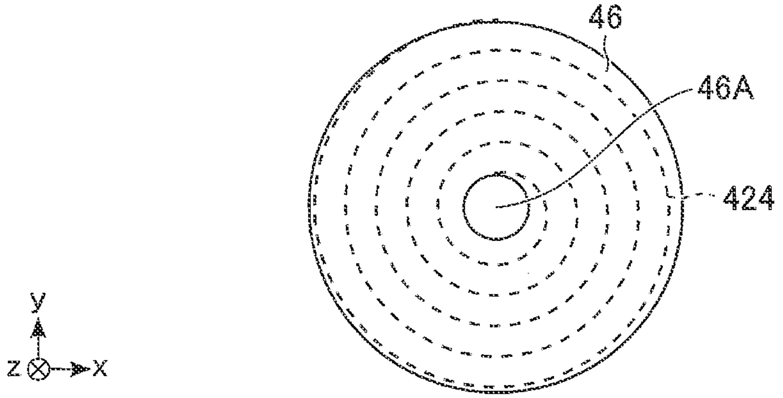
FIG. 9 shows an example of a structure of an isolator module of the isolator according to the first embodiment, along an x-y plane.

FIG. 9 shows an example of a structure of an isolator module of the isolator according to the first embodiment, along an x-y plane. FIG. 9 shows the coil 424 and the magnet 45 of the isolator module 40 only. As shown in FIG. 9, the opening 46A is accommodated inside the track of the innermost curve of the conductor (shown by a dashed line) constituting the coil 424. The opening 46A is not necessarily accommodated inside the track of the innermost curve of the conductor constituting the coil 424. It is most desirable for the center of the opening 46A to overlap the center of the coil 424 when viewed in the +z direction.

According to the first embodiment, the isolator module 40 includes the coils 414 and 424 facing each other, the magnet 45 facing the coil 424, and the magnet 46 facing the coil 414. Thus, the isolator module 40 has a high coupling coefficient, as described below.

Figure 10:
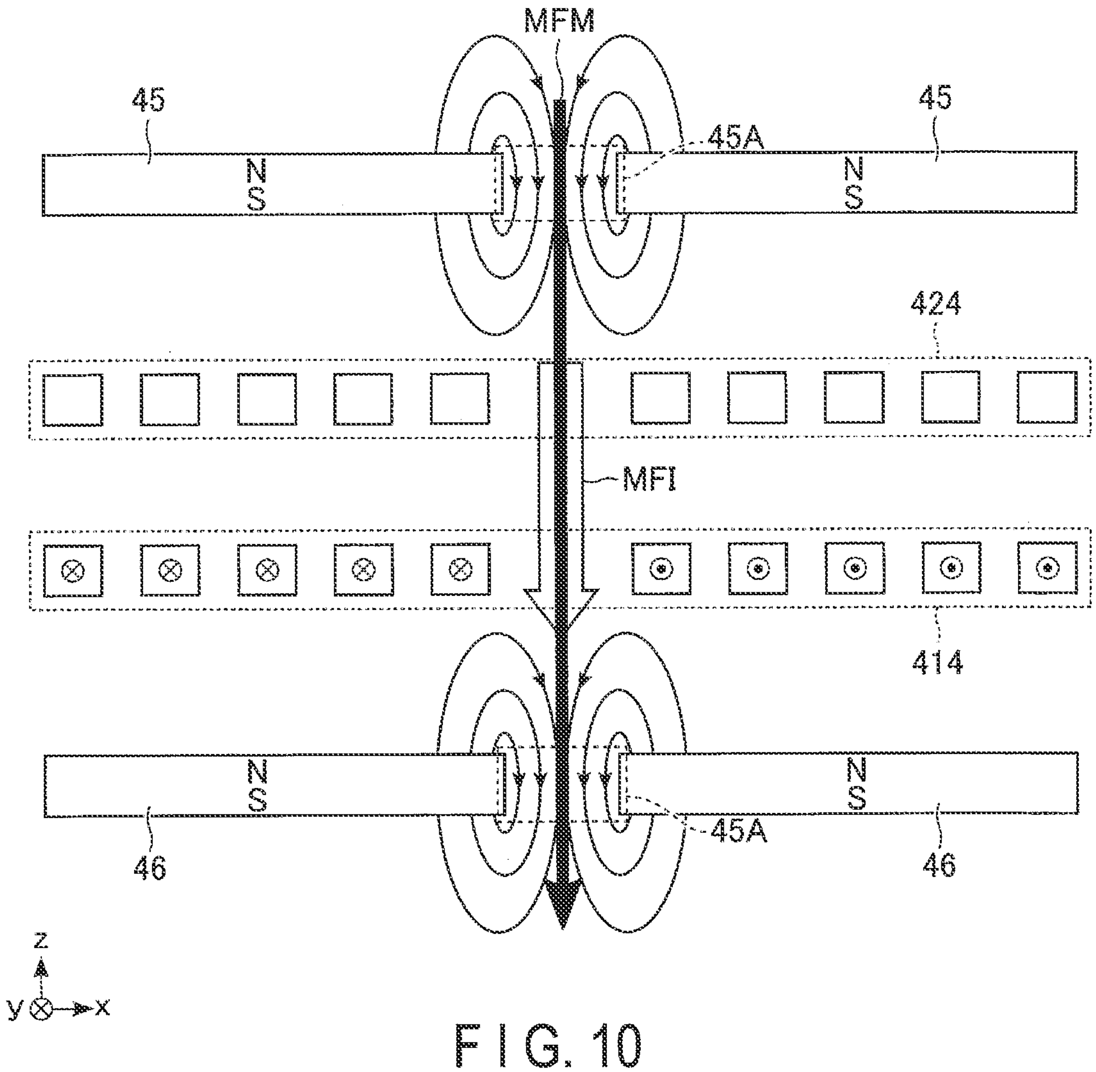
FIG. 10 shows an example of a magnetic flux generated in the isolator module of the first embodiment.

FIG. 10 shows an example of a magnetic flux generated in the isolator module of the first embodiment. As shown in FIG. 10, a magnetic flux (illustrated by thin arrows) is generated from the north pole toward the south pole of the magnet 45. The magnetic flux generated by the magnet 45 is only partially shown, and the not-shown magnetic flux is also generated in the inside area of the innermost track of the conductor of the coil 414 (the center area) and the inside area of the innermost track of the conductor of the coil 424 (the center area). Similarly, the magnetic flux generated by the magnet 46 causes a magnetic flux from the north pole to the south pole of the magnet 46, as illustrated by the thin arrows. The components of the magnetic fluxes of the magnet 45 and 46 cause a magnetic flux MFM. The magnetic flux MFM passes through the center area of the coil 414 and the center area of the coil 424.

While the isolator module 40 is operating, in other words, while signals are being transmitted from the transmit circuit to the receive circuit, a current flows in the coil 414 in a direction indicated by a symbol in each cross section of the coil 414. This current causes a magnetic flux MFI. The magnetic flux MFI passes through the center area of the coil 414 and the center area of the coil 424. A current is caused in the coil 424 by electromagnetic induction based on the magnetic flux MFI.

The magnetic flux MFM is caused in the coil 424 in such a way that it overlaps the magnetic flux MFI that causes electromagnetic induction. For this reason, the magnetic flux MFM supports electromagnetic induction when the magnetic flux MFI is generated. In other words, the magnetic flux MFM effectively increases a coupling coefficient of the coil 414 and the coil 424. Thus, the isolator module 40 has a high coupling coefficient.

Modifications of First Embodiment

FIGS. 8 and 9 show an example where the magnets 45 and 46 have almost the same outer shape as that of the coils 414 and 424 and the magnets overlap the coils 414 and 424. It suffices that, however, the magnets 45 and 46 have an outer shape equivalent to that of the coils 414 and 424. In other words, the magnet 45 may have an outer shape slightly larger or smaller than the outer shape of the coil 424, or the magnet 46 may have an outer shape slightly larger or smaller than the outer shape of the coil 414. The magnet 45 may partially overlap only the coil 424 along the x-y plane, or the magnet 46 may partially overlap only the coil 414 along the x-y plane.

Only either one of the magnet 45 or the magnet 46 may be provided.

Figure 11:
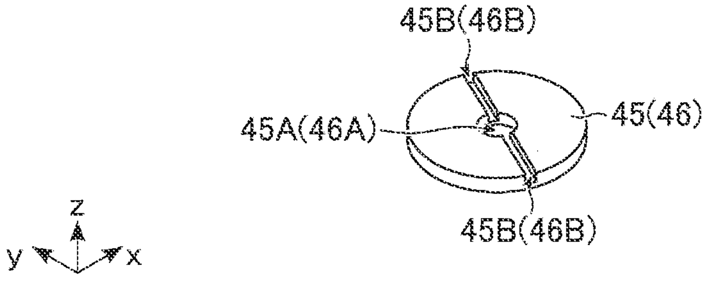
FIG. 11 is a perspective view of a magnet of an isolator according to a modification of the first embodiment.
Figure 12:
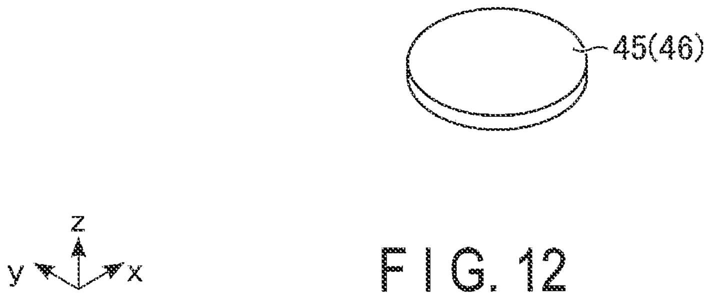
FIG. 12 is a perspective view of a magnet of an isolator according to a modification of the first embodiment.
Figure 13:
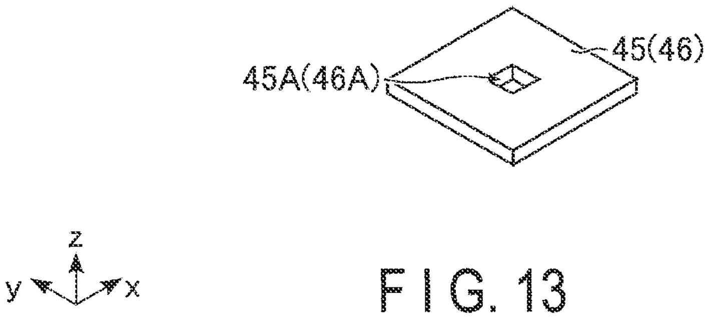
FIG. 13 is a perspective view of a magnet of an isolator according to a modification of the first embodiment.

The magnet 45 and/or the magnet 46 may have a shape other than a circular ring, as shown in FIGS. 11 to 13. FIGS. 11 to 13 are perspective views of the magnet 45 and the magnet 46 of an isolator according to modifications of the first embodiment. As shown in FIG. 11, the magnets 45 and 46 have grooves 45B and 46B, respectively. The grooves 45B and 46B respectively connect to the openings 45A and 46A and linearly extend to the respective edges of the magnets 45 and 46.

As shown in FIG. 12, the magnets 45 and 46 do not necessarily have the openings 45A and 46A, respectively. In this example, the respective edges of the magnets 45 and 46 along the x-y plane are accommodated inside the track of the innermost curve of the conductors respectively constituting the coils 424 and 414. In other words, the shape of the magnets 45 and 46 along the x-y plane has an area size smaller than a size of the area surrounded by the track of the innermost curve of the conductor constituting the coil 424 and 414.

As shown in FIG. 13, the magnets 45 and 46 may have a polygonal shape, along the x-y plane. FIG. 13 shows an example where the shape is a quadrangle. Furthermore, the openings 45A and 46A may have a polygonal shape as well.

Figure 14:
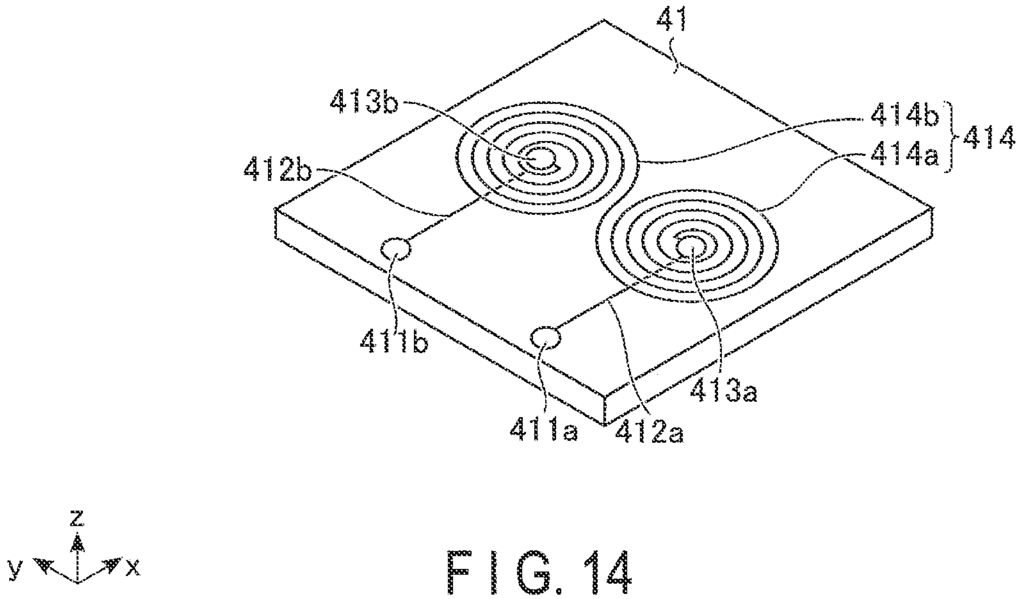
FIG. 14 is a perspective view showing a structure of a wiring board of an isolator according to the modification of the first embodiment.
Figure 15:
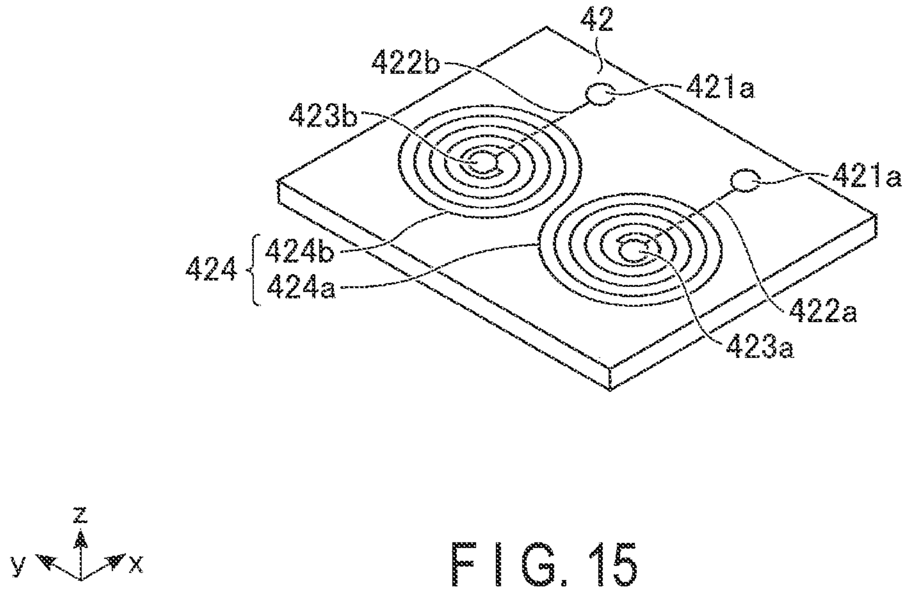
FIG. 15 is a perspective view showing a structure of a wiring board of an isolator according to the modification of the first embodiment.
Figure 16:
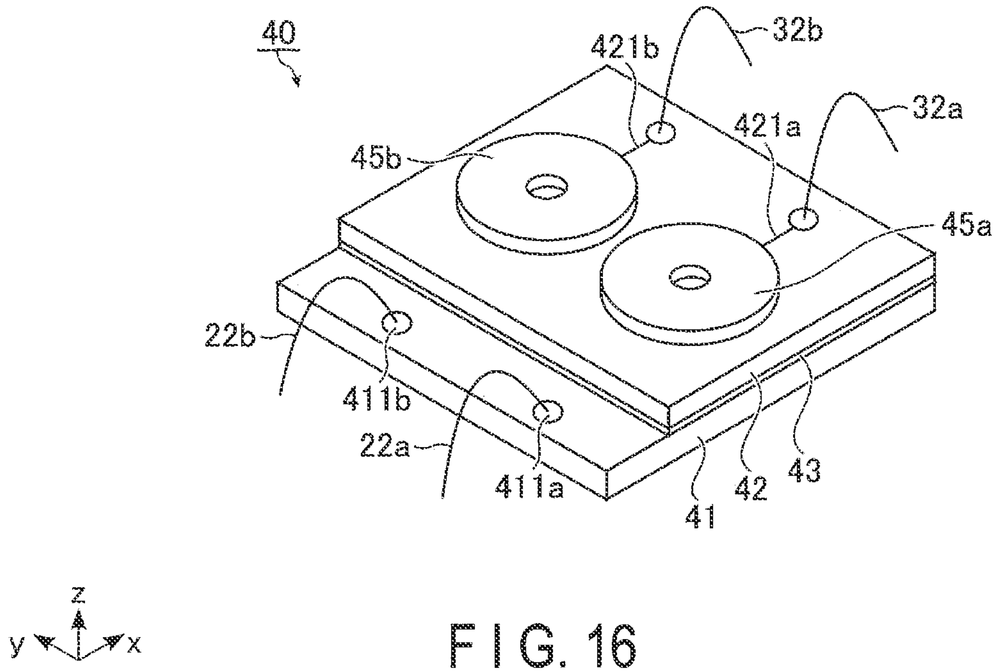
FIG. 16 is a perspective view showing a structure of the isolator module of the isolator according to the first embodiment.

The shape of the coils 414 and 424 along the x-y plane can have any shape. For example, the coil 414 and/or the coil 424 may have a shape of multiple connected spirals, as shown in FIGS. 14 to 16. FIG. 14 is a perspective view showing a structure of the wiring board 41 of the isolator according to a modification of the first embodiment. FIG. 15 is a perspective view showing a structure of the wiring board 42 of the isolator according to a modification of the first embodiment.

As shown in FIG. 14, the coil 414 includes a first part 414*a* and a second part 414*b*. The first part 414*a* and the second part 414*b* are connected to each other, continuous, and constituted by the same conductor. Each of the first part 414*a* and the second part 414*b* is a conductor having a spiral shape along the x-y plane, similarly to the foregoing coil 414 described with reference to FIG. 5; in other words, the track of the line-form conductor respectively constituting the first part 414*a* and the second part 414*b* forms a shape of a spiral along the x-y plane.

The central end of the first part 414*a* is coupled to the plug 413*a*. The outer periphery end of the first part 414*a* is coupled to the outer periphery end of the second part 414*b*. The central end of the second part 414*b* is coupled to the plug 413*b*.

As shown in FIG. 15, the coil 424 includes a first part 424*a* and a second part 424*b*. The first part 424*a* and the second part 424*b* are connected to each other, continuous, and constituted by the same conductor. Each of the first part 424*a* and the second part 424*b* is a conductor having a spiral shape along the x-y plane, similarly to the foregoing coil 424 described with reference to FIG. 6; in other words, the track of each of the line-form conductors respectively constituting the first part 424*a* and the second part 424*b* forms a shape of a spiral along the x-y plane.

The central end of the first part 424*a* is coupled to the plug 423*a*. The outer periphery end of the first part 424*a* is coupled to the outer periphery end of the second part 424*b*. The central end of the second part 424*b* is coupled to the plug 423*b*.

The area surrounded by the innermost curve of the track of the first part 424*a* of the coil 424 partially overlaps the area surrounded by the innermost curve of the track of the first part 414*a* of the coil 414. The area surrounded by the innermost curve of the track of the second part 424*b* of the coil 424 partially overlaps the area surrounded by the innermost curve of the track of the second part 414*b* of the coil 414.

Figure 17:
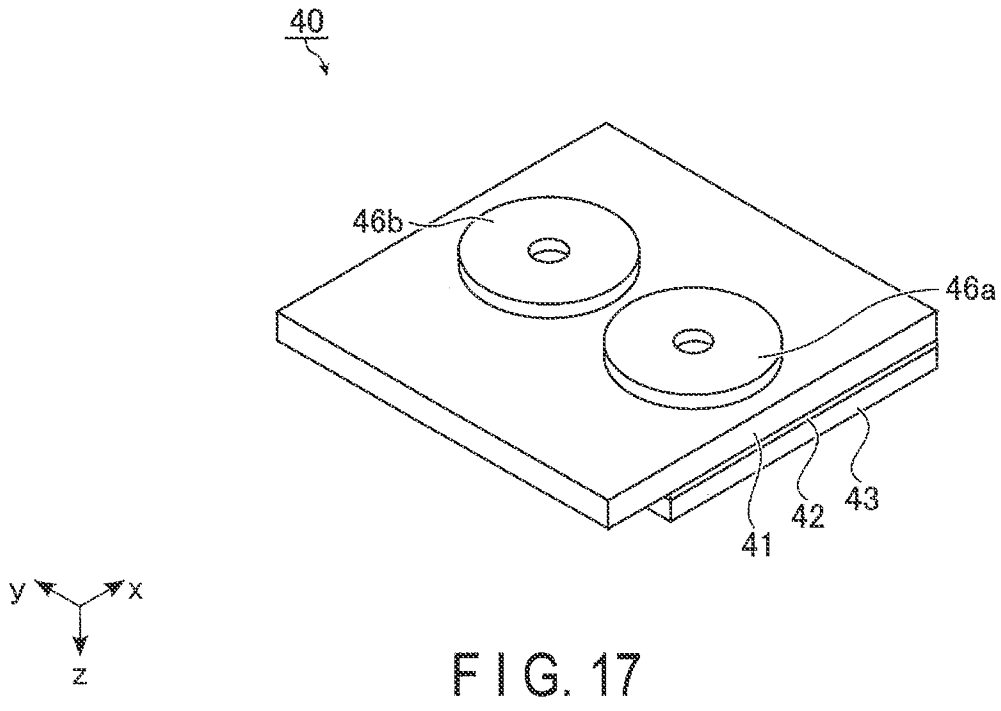
FIG. 17 is a perspective view showing a structure of the isolator module of the isolator according to the first embodiment.

Based on the fact that each of the coils 414 and 424 have a structure of two connected spirals as shown in FIGS. 14 and 15, the isolator module 40 can include additional magnets 45 and 46. FIGS. 16 and 17 are perspective views respectively showing examples of a structure of the isolator module according to modifications of the first embodiment.

FIG. 16 also shows conductors inside the wiring boards 41 and 42. FIG. 16 shows the lower surface of the isolator module 40. FIG. 17 shows the lower surface of the isolator module 40.

As shown in FIG. 16, the isolator module 40 includes two magnets 45 (45*a* and 45*b*). The magnet 45*a* is located immediately above the first part 424*a* of the coil 424. The opening of the magnet 45*a* is accommodated inside the track of the innermost curve of the conductor constituting the first part 424*a* of the coil 424. The opening is not necessarily accommodated inside the track of the innermost curve of the conductor constituting the first portion 424*a*. It is most desirable for the center of the opening to overlap the center of the first part 424*a* when viewed in the +z direction. The magnet 45*a* does not overlap the second part 424*b* of the coil 424 when viewed in the +z direction.

The magnet 45*b* is located immediately above the second part 424*b* of the coil 424. The opening of the magnet 45*b* is accommodated inside the track of the innermost curve of the conductor constituting the second part 424*b* of the coil 424. The opening is not necessarily accommodated inside the track of the innermost curve of the conductor constituting the second part 424*b*. It is most desirable for the center of the opening to overlap the center of the second part 424*b* when viewed in the +z direction. The magnet 45*b* does not overlap the first part 424*a* of the coil 424 when viewed in the +z direction.

As shown in FIG. 17, the isolator module 40 includes two magnets 46 (46*a* and 46*b*). The magnet 46*a* is located immediately below the first part 414*a* of the coil 414. The opening of the magnet 46*a* is accommodated inside the track of the innermost curve of the conductor constituting the first part 414*a* of the coil 414. The opening is not necessarily accommodated inside the track of the innermost curve of the conductor constituting the first part 414*a*. It is most desirable for the center of the opening to overlap the center of the first part 414*a* when viewed in the +z direction. The magnet 46*a* does not overlap the second part 414*b* of the coil 414 when viewed in the +z direction.

The magnet 46*b* is located immediately below the second part 414*b* of the coil 414. The opening of the magnet 46*b* is accommodated inside the track of the innermost curve of the conductor constituting the second part 414*b* of the coil 414. The opening is not necessarily accommodated inside the track of the innermost curve of the conductor constituting the second part 414*b*. It is most desirable for the center of the opening to overlap the center of the second part 414*b* when viewed in the +z direction. The magnet 46*b* does not overlap the first part 414*a* of the coil 414 when viewed in the +z direction.

Figure 18:
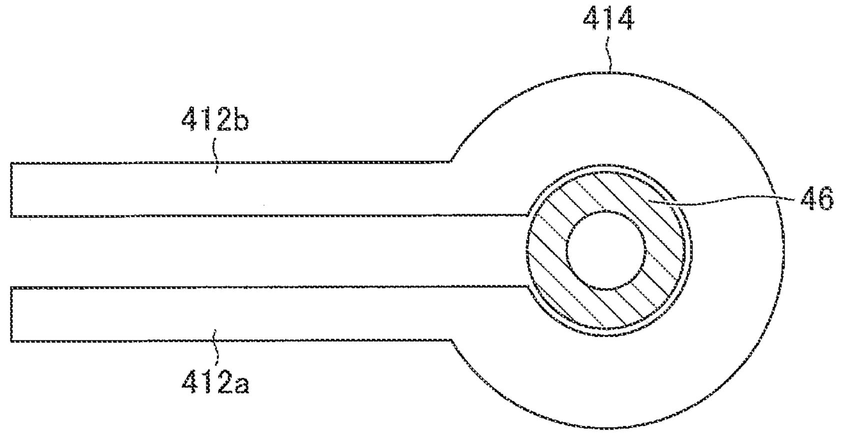
FIG. 18 shows an example of a structure of an isolator according to a modification of the first embodiment, along an x-y plane.

As shown in FIG. 18, the coils 414 and 424 may be constituted by a single winding. FIG. 18 shows an example of a structure of an isolator according to a modification of the first embodiment, in an x-y plane. FIG. 18 shows the coil 414 and the magnet 46 only. As shown in FIG. 18, the area size of the magnet 46 along the x-y plane is smaller than a size of the area surrounded by the track of the curve of the conductor constituting the coil 414. The coil 414 is accommodated in an area surrounded by the track of the curve of the conductor constituting the coil 414.

The shape of the coil 424 along the x-y plane is the shape of the coil 414 inverted with respect to the y-axis. The shape of the magnet 45 along the x-y plane has an area size smaller than a size of the area surrounded by the track of the curve of the conductor constituting the coil 424. The coil 424 is accommodated in an area surrounded by the track of the curve of the conductor constituting the coil 424.

2. Second Embodiment

The wiring boards 41 and 42 may be formed on the same substrate, instead of being separately formed and joined together as in the first embodiment. The second embodiment relates to such an example.

Figure 19:
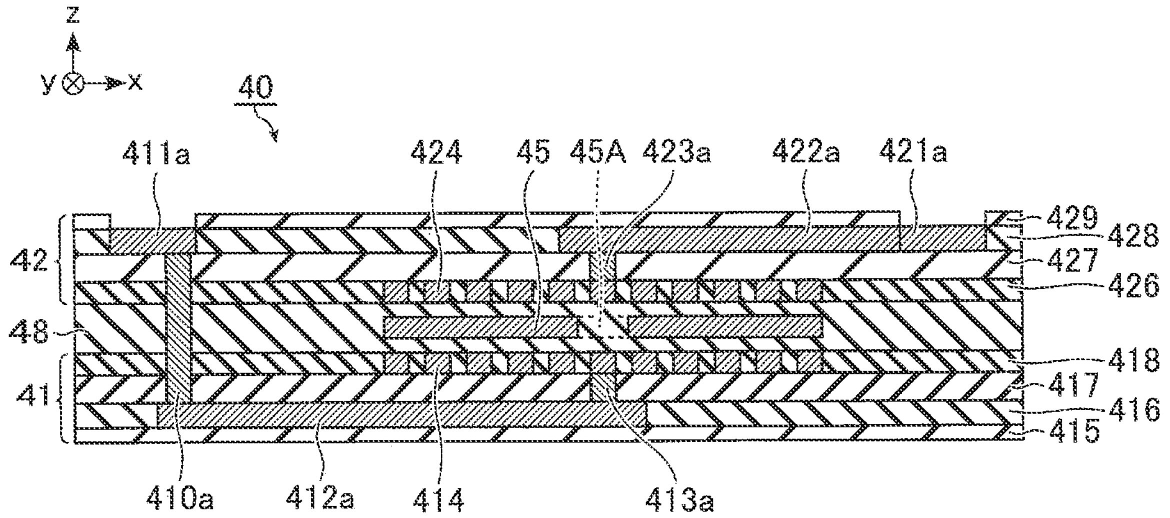
FIG. 19 shows an example of a cross-sectional structure of an isolator module according to a second embodiment.

FIG. 19 shows an example of a cross-sectional structure of an isolator module according to the second embodiment. As shown in FIG. 19, the isolator module 40 does not include an insulator 43 but includes a substrate 48. The substrate 48 is located at the same position as where the insulator 43 is located in the first embodiment.

The wiring boards 41 and 42 have the same shape along the x-y plane, and the upper surface of the wiring board 41 is covered by the wiring board 42, for example. The wiring board 41 does not include an insulator 419. The substrate 48 is located on the upper surface of the insulator 418. The wiring board 42 does not include an insulator 425. The insulator 426 is located on the upper surface of the substrate 48.

The pad 411*a* and the not-shown pad 411*b* are located within the wiring board 42. In other words, the insulator 428 has two additional openings, and the pads 411*a* and 411*b* are located within these openings respectively.

The lower surface of the pad 411*a* is in contact with the upper surface of the plug 410*a*. The plug 410*a* penetrates the insulators 417 and 418, the substrate 48, and the insulators 426 and 427. The lower surface of the plug 410*a* is in contact with the upper surface of the conductor 412*a*.

Similarly, the lower surface of the pad 411*b* (not shown) is in contact with the upper surface of the plug 410*b* (not shown). The plug 410*b* penetrates the insulators 417 and 418, the substrate 48, and the insulators 426 and 427. The lower surface of the plug 410*b* is in contact with the upper surface of the conductor 412*b* (not shown).

The magnet 45 is located within the substrate 48.

Also with the structure of the isolator module 40 according to the second embodiment, the magnet 45 can generate a magnetic flux MFM that intensifies a magnetic flux MFI that causes a magnetoelectric induction in the coil 424. Therefore, it is possible to achieve a high coupling coefficient similarly to the first embodiment.

3. Third Embodiment

The third embodiment differs from the first embodiment in a structure for generating a magnetic flux MFM for intensifying a magnetic flux MFI that causes a magnetoelectric induction in the coil 424. The third embodiment is applied to a case where the coils 414 and 424 are a single winding.

Figure 20:
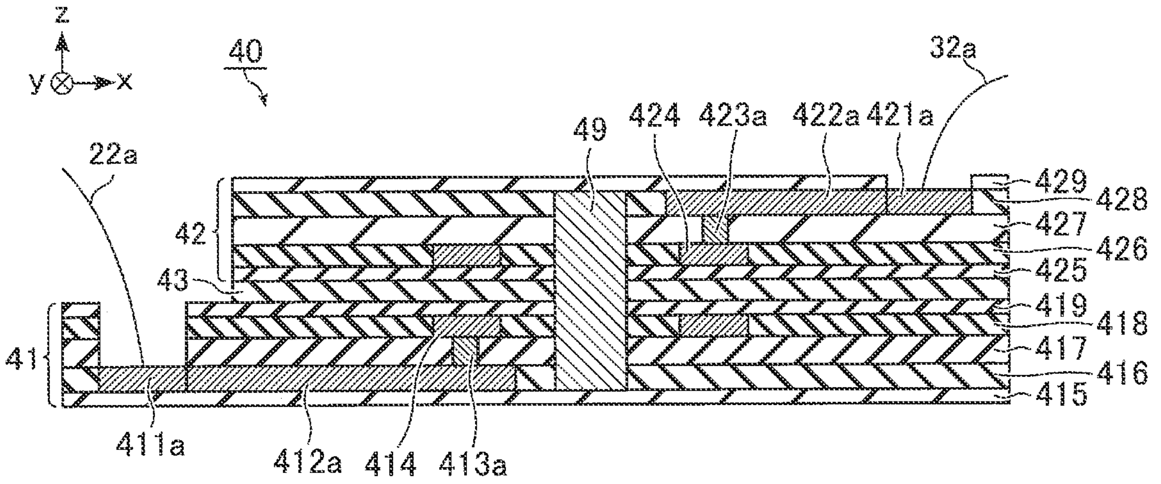
FIG. 20 shows an example of a cross-sectional structure of an isolator module according to a third embodiment.

FIG. 20 shows an example of a cross-sectional structure of an isolator module according to the third embodiment. As shown in FIG. 20, the isolator module 40 includes a magnetic material 49 instead of the magnets 45 and 46 in the first embodiment as a structure for generating a magnetic flux MFM that intensifies the magnetic flux MFI that causes a magnetoelectric induction in the coil 424. The magnetic material 49 has a shape of a pillar that extends along the z-axis, for example a cylindrical shape. The magnetic material 49 penetrates the insulators 416, 417, 418, 419, 425, 426, 427, and 428. The edge of the magnetic material 49 along the x-y plane is accommodated inside the track of the innermost curve of the conductor that constitutes the coils 424 and 414. In other words, the shape of the magnetic material 49 along the x-y plane has an area size smaller than a size of the area surrounded by the track of the innermost curve of the conductor constituting the coil 424 and 414. The magnetic material 49 includes iron, for example.

Figure 21:
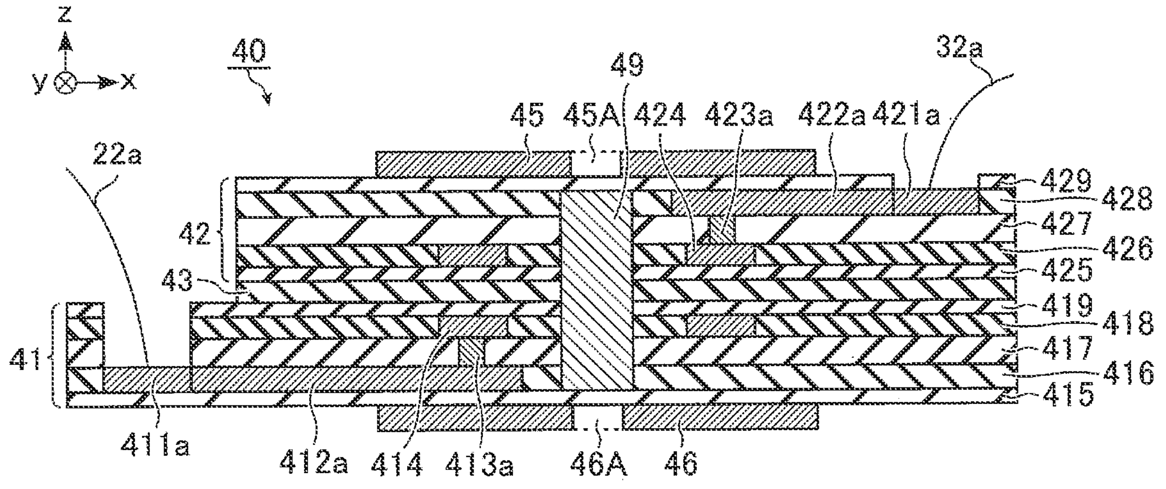
FIG. 21 shows an example of a cross-sectional structure of an isolator module according to a third embodiment.

The isolator module of the third embodiment may further include the magnet 45 and/or the magnet 46, as shown in FIG. 21. Similarly to the second embodiment, a substrate 48 may be provided in place of a set of the insulators 419, 43, and 425.

According to the third embodiment, the magnetic material 49 can generate a magnetic flux MFM that intensifies a magnetic flux MFI that causes electromagnetic induction in the coil 424. Therefore, it is possible to achieve a high coupling coefficient similarly to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:

a first coil having a spiral shape along a first plane;

a second coil aligned with the first coil along a first axis intersecting the first plane, facing the first coil, and having a spiral shape along the first plane;

a plate-shaped first magnet provided on a side of the second coil and facing the second coil, the side being opposite to a side where the first coil is located, the first magnet extending along the first plane, the first magnet including a first surface and a second surface that is located farther from the second coil than the first surface along the first axis, the first surface being a south pole, the second surface being a north pole, the first magnet having a first opening extending between the first surface and the second surface;

a plate-shaped second magnet provided on a side of the first coil and facing the first coil, the side being opposite to a side where the second coil is located, the second magnet extending along the first plane, the second magnet including a third surface and a fourth surface that is located farther from the first coil than the third surface along the first axis, the third surface being a north pole, the fourth surface being a south pole, the second magnet having a second opening extending between the third surface and the fourth surface; and a first insulator that seals the first coil, the second coil, the first magnet, and the second magnet.

2. The isolator of claim 1, wherein the second coil and the first magnet overlap, when viewed along the first axis.

3. The isolator of claim 1, wherein the first magnet covers the second coil, when viewed along the first axis.

4. The isolator of claim 1, wherein the first coil and the second magnet overlap, when viewed along the first axis.

5. The isolator of claim 4, wherein the second magnet covers the first coil, when viewed along the first axis.

6. The isolator of claim 1, wherein the first coil and the second coil have a conductor having a track extending along the first plane.

7. The isolator of claim 1, further comprising:

a first wiring board that includes the first coil and a second insulator that covers the first coil; and a second wiring board that includes the second coil and a third insulator that covers the second coil.

* * * * *